(12) United States Patent
Chen et al.

(10) Patent No.: US 8,169,014 B2
(45) Date of Patent: May 1, 2012

(54) INTERDIGITATED CAPACITIVE STRUCTURE FOR AN INTEGRATED CIRCUIT

(75) Inventors: Yueh-You Chen, Hsin-Chu (TW); Chung-Long Chang, Dou-Liu (TW); Chih-Ping Chao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 791 days.

(21) Appl. No.: 11/328,502

(22) Filed: Jan. 9, 2006

(65) Prior Publication Data

US 2007/0158783 A1   Jul. 12, 2007

(51) Int. Cl.
*H01L 29/92* (2006.01)
(52) U.S. Cl. ........ 257/307; 257/306; 257/532; 257/534; 257/E27.048; 257/E21.008; 438/396
(58) Field of Classification Search .................. 257/307, 257/E27.048, 306, 532, 534, E21.008; 438/399, 438/396
See application file for complete search history.

(56) References Cited

U.S. PATENT DOCUMENTS

| | | | |
|---|---|---|---|
| 2,721,965 A | 10/1955 | Hall | |
| 2,861,321 A | 11/1958 | Barnard et al. | |
| 3,649,878 A | 3/1972 | Schneider | |
| 3,657,609 A | 4/1972 | Oswald et al. | |
| 3,879,645 A | 4/1975 | Rutt et al. | |
| 4,005,377 A | 1/1977 | Engeler | |
| 4,071,878 A | 1/1978 | Stynes | |
| 4,126,836 A | 11/1978 | Carnes et al. | |
| 4,156,249 A | 5/1979 | Koo | |
| 4,249,196 A | 2/1981 | Durney et al. | |
| 4,286,122 A | 8/1981 | Iding | |
| 4,301,580 A | 11/1981 | Wallace | |
| 4,347,650 A | 9/1982 | Mc Larney et al. | |
| 4,398,099 A | 8/1983 | Benoit-Gonin et al. | |
| 4,409,608 A | 10/1983 | Yoder | |

(Continued)

FOREIGN PATENT DOCUMENTS

EP    0 391 123 A2    10/1990

(Continued)

OTHER PUBLICATIONS

Aparicio, R., et al., "Capacity Limits and Matching Properties of Lateral Flux Integrated Capacitors," IEEE, Los Alamitos, CA., 2001, 4 pgs.

*Primary Examiner* — Matthew E Warren
*Assistant Examiner* — John Lin
(74) *Attorney, Agent, or Firm* — Slater & Matsil, L.L.P.

(57) ABSTRACT

System and method for an improved interdigitated capacitive structure for an integrated circuit. A preferred embodiment comprises a first layer of a sequence of substantially parallel interdigitated strips, each strip of either a first polarity or a second polarity, the sequence alternating between a strip of the first polarity and a strip of the second polarity. A first dielectric layer is deposited over each strip of the first layer of strips. A first extension layer of a sequence of substantially interdigitated extension strips is deposited over the first dielectric layer, each extension strip deposited over a strip of the first layer of the opposite polarity. A first sequence of vias is coupled to the first extension layer, each via deposited over an extension strip of the same polarity. A second layer of a sequence of substantially parallel interdigitated strips can be coupled to the first sequence of vias.

14 Claims, 8 Drawing Sheets

U.S. PATENT DOCUMENTS

| | | |
|---|---|---|
| 4,419,714 A | 12/1983 | Locke |
| 4,427,457 A | 1/1984 | Carlson et al. |
| 4,430,522 A | 2/1984 | Bader |
| 4,453,199 A | 6/1984 | Ritchie et al. |
| 4,456,917 A | 6/1984 | Sato et al. |
| 4,458,294 A | 7/1984 | Womack |
| 4,470,098 A | 9/1984 | Alexander |
| 4,517,406 A | 5/1985 | Erdle |
| 4,574,255 A | 3/1986 | Fujii et al. |
| 4,584,074 A | 4/1986 | Sterling et al. |
| 4,599,788 A | 7/1986 | Love et al. |
| 4,615,088 A | 10/1986 | Bernard et al. |
| 4,672,506 A | 6/1987 | Deguchi et al. |
| 4,687,540 A | 8/1987 | Singhdeo et al. |
| 4,689,116 A | 8/1987 | Coissard et al. |
| 4,696,082 A | 9/1987 | Fonfria et al. |
| 4,697,159 A | 9/1987 | Sechi et al. |
| 4,700,457 A | 10/1987 | Matsukawa |
| 4,836,861 A | 6/1989 | Peltzer et al. |
| 4,870,539 A | 9/1989 | Chance et al. |
| 4,896,201 A | 1/1990 | Kemmer et al. |
| 4,916,576 A | 4/1990 | Herbert et al. |
| 4,918,454 A | 4/1990 | Early et al. |
| 4,929,998 A | 5/1990 | Boudewijns |
| 4,931,755 A | 6/1990 | Sakamoto et al. |
| 4,931,899 A | 6/1990 | Pruett |
| 4,949,217 A | 8/1990 | Ngo |
| 5,062,025 A | 10/1991 | Verhoeven et al. |
| 5,065,275 A | 11/1991 | Fujisaki et al. |
| 5,072,329 A | 12/1991 | Galvagni |
| 5,125,138 A | 6/1992 | Shaw et al. |
| 5,140,389 A | 8/1992 | Kimura et al. |
| 5,153,540 A | 10/1992 | Gliha, Jr. |
| 5,168,075 A | 12/1992 | Kuo |
| 5,177,670 A | 1/1993 | Shinohara et al. |
| 5,179,773 A | 1/1993 | Monsees et al. |
| 5,187,548 A | 2/1993 | Baek et al. |
| 5,196,365 A | 3/1993 | Gotou |
| 5,198,967 A | 3/1993 | Kuranuki et al. |
| 5,208,725 A * | 5/1993 | Akcasu ........................ 361/313 |
| 5,212,402 A | 5/1993 | Higgins, III |
| 5,214,564 A | 5/1993 | Metzler et al. |
| 5,217,918 A | 6/1993 | Kim et al. |
| 5,220,483 A | 6/1993 | Scott |
| 5,227,322 A | 7/1993 | Ko et al. |
| 5,229,911 A | 7/1993 | Ditlya |
| 5,236,860 A | 8/1993 | Fazan et al. |
| 5,238,861 A | 8/1993 | Morin et al. |
| 5,241,497 A | 8/1993 | Komarek |
| 5,245,505 A | 9/1993 | Shiga et al. |
| 5,262,343 A | 11/1993 | Rhodes et al. |
| 5,262,662 A | 11/1993 | Gonzalez et al. |
| 5,266,512 A | 11/1993 | Kirsch |
| 5,268,322 A | 12/1993 | Lee et al. |
| 5,290,726 A | 3/1994 | Kim |
| 5,298,775 A | 3/1994 | Ohya |
| 5,378,908 A | 1/1995 | Chin et al. |
| 5,573,967 A | 11/1996 | Tseng |
| 5,583,359 A * | 12/1996 | Ng et al. ........................ 257/306 |
| 6,117,747 A | 9/2000 | Shao et al. |
| 6,680,542 B1 | 1/2004 | Gibson et al. |
| 6,743,671 B2 | 6/2004 | Hu et al. |
| 6,819,542 B2 | 11/2004 | Tsai et al. |
| 7,041,569 B1 * | 5/2006 | Kar-Roy et al. ............... 438/396 |
| 2003/0092259 A1 | 5/2003 | Ng et al. |
| 2004/0174655 A1 | 9/2004 | Tsai et al. |

FOREIGN PATENT DOCUMENTS

| | | |
|---|---|---|
| EP | 0 447 550 A1 | 9/1991 |
| EP | 0 351 343 B1 | 7/1993 |
| EP | 0 389 020 B1 | 6/1994 |
| EP | 0 491 542 B1 | 3/1995 |
| EP | 0 377 502 B1 | 12/1995 |
| EP | 0 455 340 B1 | 12/1995 |
| EP | 1398834 A2 | 3/2004 |
| JP | 61-283108 | 12/1986 |
| WO | WO 90/10370 | 9/1990 |
| WO | WO 01/99163 A2 | 12/2001 |

* cited by examiner

INTERDIGITATED CAPACITIVE STRUCTURE FOR AN INTEGRATED CIRCUIT

TECHNICAL FIELD

The present invention relates generally to capacitors for integrated circuits, and more particularly to system and method for an improved interdigitated capacitive structure for an integrated circuit.

BACKGROUND

Generally, capacitors are employed in integrated circuits to perform a variety of functions. Capacitors can be used to construct band pass filters, phase locked loops (PLLs), dynamic random access memory (DRAM) components, and a host of other useful devices. In some instances, some common elements of an integrated circuit exhibit inherent capacitance.

For example, certain active integrated circuit elements, such as, for example, bipolar and metal-oxide-semiconductor (MOS) transistors, contain electrical junctions that exhibit capacitance. In fact, depending on the particular type of transistor, a depletion region of an electrical junction can be described as functionally equivalent to a small parallel-plate capacitor. Such a capacitor can be modeled as a fixed-value capacitor, or as a variable capacitor, with a capacitance that changes as a function of the voltage applied to the junction. Furthermore, certain passive integrated circuit elements, such as, for example, polycrystalline silicon (polysilicon) and metal lines, also have inherent capacitance with respect to each other and to any other conductors.

One disadvantage, however, in employing such inherent capacitance to achieve certain functionality, is that the inherent capacitance is often insufficient and difficult to engineer. For example, because this inherent capacitance is typically a byproduct of some other functionality for which the particular element is designed, the inherent capacitance cannot be a higher design priority than the primary functionality. Moreover, because inherent capacitance is tied to a particular element, the capacitive effect is tied to that element's location in a circuit and cannot be relocated. Thus, integrated circuits often employ dedicated capacitors as circuit elements in their own right.

Traditional capacitors are two conductive materials separated by a dielectric. In integrated circuits, the two conductive materials are often flat plates with an intervening layer of dielectric material. One significant disadvantage of this approach, however, is that a relatively large area of the integrated circuit chip is typically required to achieve the desired capacitance.

One structure employed to increase capacitance is a metal-insulator-metal (MIM) capacitor. In its simplest configuration, a number of horizontal parallel plates of metal are stacked into several layers, separated by dielectrics. The plates are conductive and alternately coupled to form opposite electrodes of a capacitor. The vertical stack of plates is simple to construct, and offers more capacitance per unit area than two conductive surfaces alone. However, while simple to construct, forming a MIM capacitor with many layers often requires additional processing steps, which can add prohibitive cost to the manufacturing process.

Another structure employed to increase capacitance is a metal-oxide-metal (MOM) capacitor. Generally, MOM capacitors consist of strips of conductive material of opposite polarity separated by dielectric material. MOM capacitors can often take advantage of existing process steps. For example, the dual-damascene techniques typically used with copper multilevel interconnection metallization on integrated circuits can be used to construct stacks of copper-filled vias and trenches. Two or more such copper-filled vias or trenches, separated by oxide dielectrics, can form a MOM capacitor. MOM capacitors offer greater capacitance per unit area than traditional capacitors, with an efficient form. However, MOM capacitors also typically require a complex design, which can overcome benefits gained by taking advantage of standard semiconductor device manufacture process steps.

Some modern methods employ both MOM and MIM capacitors. However, typically these capacitors, when combined, are formed on separate layers of an integrated circuit, with a MIM capacitor layer stacked above a MOM capacitor layer. Thus, while the capacitance is increased, the vertical chip area required is also increased, which can also add complexity to the design and manufacturing process.

Furthermore, some MOM capacitors are formed with vertical stacks of MOM layers. While these stacked MOM capacitors can offer increased capacitance, however, mismatches in alignment between layers can cause uncertainty in the manufacturing process and performance degradation. At the very least, where the stacks are not aligned the actual capacitance deviates from the expected capacitance, which can cause other devices that depend on the capacitor to behave unpredictably, cascading through the chip.

Therefore, there is a need for a system and/or method for forming improved integrated circuit capacitors that overcomes at least some of the disadvantages associated with previous systems and methods.

SUMMARY OF THE INVENTION

These and other problems are generally solved or circumvented, and technical advantages are generally achieved, by preferred embodiments of the present invention, which provides a system and method for an improved interdigitated capacitive structure for an integrated circuit.

In accordance with a preferred embodiment of the present invention, a method for fabricating a capacitor structure comprises forming a first layer of a sequence of substantially parallel interdigitated strips, each strip of either a first polarity or a second polarity, the sequence alternating between a strip of the first polarity and a strip of the second polarity. A first dielectric layer is deposited over each strip of the first layer of strips. A first extension layer of a sequence of substantially interdigitated extension strips is formed over the first dielectric layer, each extension strip of either the first polarity or the second polarity, the sequence alternating between an extension strip of the first polarity and an extension strip of the second polarity, each extension strip deposited over a strip of the first layer of the opposite polarity. A first sequence of vias is formed over the first extension layer, each via of either the first polarity or the second polarity, the sequence alternating between a via of the first polarity and a via of the second polarity, each via deposited over an extension strip of the same polarity. A second layer of a sequence of substantially parallel interdigitated strips is formed over the first sequence of vias, each strip of either the first polarity or the second polarity, each strip deposited over a via of the same polarity.

In accordance with another preferred embodiment of the present invention, a capacitor structure for an integrated circuit comprises a first layer of a sequence of substantially parallel interdigitated strips, each strip of either a first polarity or a second polarity, the sequence alternating between a strip of the first polarity and a strip of the second polarity. A first dielectric layer is deposited over each strip of the first layer of strips. A first extension layer of a sequence of substantially interdigitated extension strips is deposited over the first dielectric layer, each extension strip of either the first polarity or the second polarity, the sequence alternating between an extension strip of the first polarity and an extension strip of the second polarity, each extension strip deposited over a strip of the first layer of the opposite polarity. A first sequence of vias is coupled to the first extension layer, each via of either the first polarity or the second polarity, the sequence alternating between a via of the first polarity and a via of the second polarity, each via deposited over an extension strip of the same polarity. A second layer of a sequence of substantially parallel interdigitated strips is coupled to the first sequence of vias, each strip of either the first polarity or the second polarity, each strip deposited over a via of the same polarity.

An advantage of a preferred embodiment of the present invention is efficiently combining MOM and MIM-type capacitors. The layers of substantially parallel interdigitated strips can be configured similarly to existing MOM capacitors. The first dielectric layer and the first extension layer add MIM-type capacitance to the first layer of interdigitated strips. Thus, the MIM-type capacitor is sandwiched between layers of MOM capacitors, connected through vias.

A further advantage of a preferred embodiment of the present invention is reducing vertical chip area required for a desired capacitance per unit area. The addition of MIM-type capacitance between layers of a MOM capacitor adds surface area and extends the capacitive effect of one layer of MOM capacitor strips on the layer below it, between strips on the same layer, and between adjacent vias. Accordingly, the effective capacitance per unit area is increased, without additional process steps or expanding the vertical chip area required for a MOM capacitor.

Yet another advantage of a preferred embodiment of the present invention is improving mismatch performance. The addition of MIM-type capacitance between layers, coupled through vias to a layer above the MIM-type layer adds structural support that can offset mismatches in alignment between MOM capacitor strips. Further, the expanded capacitive field of the MIM-type layer and the associated vias improves the capacitive performance in the presence of mismatches in alignment between MOM capacitor strips.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an improved interdigitated capacitive structure for an integrated circuit. The invention may also be applied, however, to other capacitive structures, such as, for example, standard MOM capacitors, multi-level MOM capacitors, standard MIM capacitors, and other suitable capacitive structures, as one skilled in the art will understand.

Figure 1:
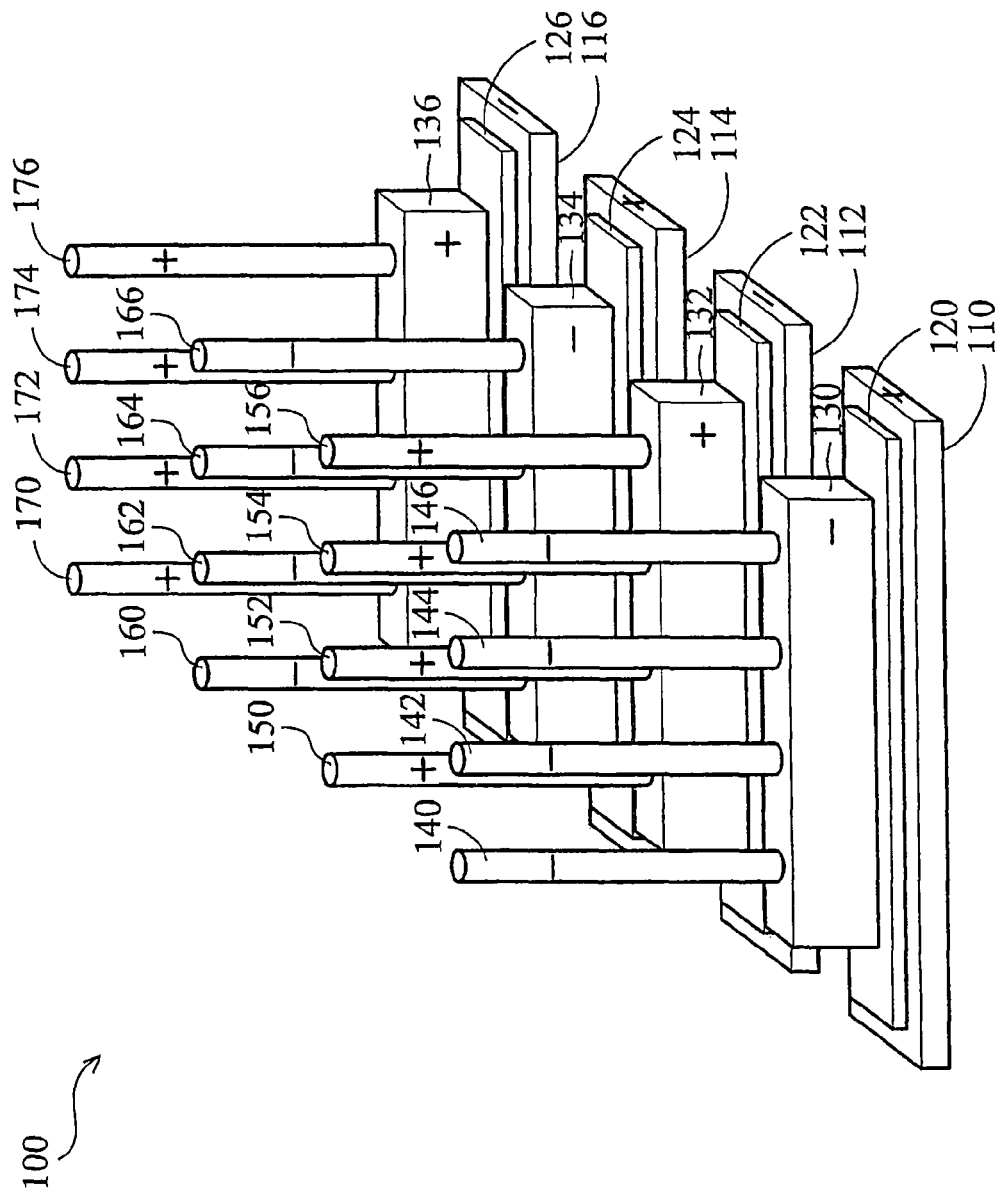
FIG. 1 is a schematic cross sectional view illustrating features of a preferred embodiment of a capacitive structure for an integrated circuit.

With reference now to FIG. 1, there is shown a schematic cross sectional view of a capacitive structure for an integrated circuit, generally indicated by reference numeral 100. As illustrated, capacitor 100 includes a layer 102 of substantially parallel interdigitated capacitive strips 110, 112, 114, and 116. Each capacitive strip is of either a first polarity or a second polarity, indicated by either a "plus" sign (+) or a "minus" sign (−). As shown, the capacitive strips are interdigitated, with alternating polarities. Accordingly, strip 110 is of positive polarity, strip 112 is of negative polarity, strip 114 is of positive polarity, and strip 116 is of negative polarity.

One skilled in the art will understand that the plurality of conductive strips form a first layer of a MOM-type capacitive structure. In the illustrated embodiment, four conductive strips are shown. One skilled in the art will understand that any number of conductive strips, and the structures formed above each strip, can also be employed.

A layer 104 of dielectric material is disposed on top of the layer 102. As illustrated, layer 104 is comprised of strips of dielectric material 120, 122, 124, and 126 deposited on top of each strip. As shown, each strip of dielectric material is thinner than the capacitive strip of layer 102 to which it is coupled. Furthermore, one skilled in the art will understand that a dielectric material (not shown) can be employed to separate the other structures as described below.

A layer 106 of extension strips 130, 132, 134, and 136 is disposed on top of the layer 104. Each extension strip is of either a first or second polarity and is of the opposite polarity than the conductive strip directly below it. For example, extension strip 130 is of negative polarity and capacitive strip 110 is of positive polarity. Similarly, extension strip 132 is of positive polarity and capacitive strip 112 is of negative polarity. One skilled in the art will understand that the combination of an extension strip, dielectric material, and underlying capacitive strip of opposite polarity form a MIM-type capacitive structure.

The layer 106 is coupled to another layer of capacitive strips above (not shown) through a layer 108 of vias. Each via is of either a first or second polarity and is of the same polarity as the extension strip to which it is coupled. For example, extension strip 130 is of negative polarity and vias 140, 142, 144, and 146 are also of negative polarity. Similarly, extension strip 132 is of positive polarity and vias 150, 152, 154, and 156 are also of positive polarity.

Together layers 102, 104, 106, and 108 make up a stackable capacitance unit. Thus, a second capacitor 100 can be stacked on top of capacitor 100 for an additional layer of MOM/MIM-type capacitance. When thus stacked, the layer 108 of vias couples to a layer 102 above it of the same polarity as the vias. For example, in a second layer 102 stacked above layer 108, the capacitive strip that couples to vias 140-146 would be of negative polarity and the capacitive strip that couples to vias 150-156 would be of negative polarity. Further, in a preferred embodiment, there is a single additional layer 102 coupled to the last layer 108 of a series of stacked capacitors 100.

Figure 2:
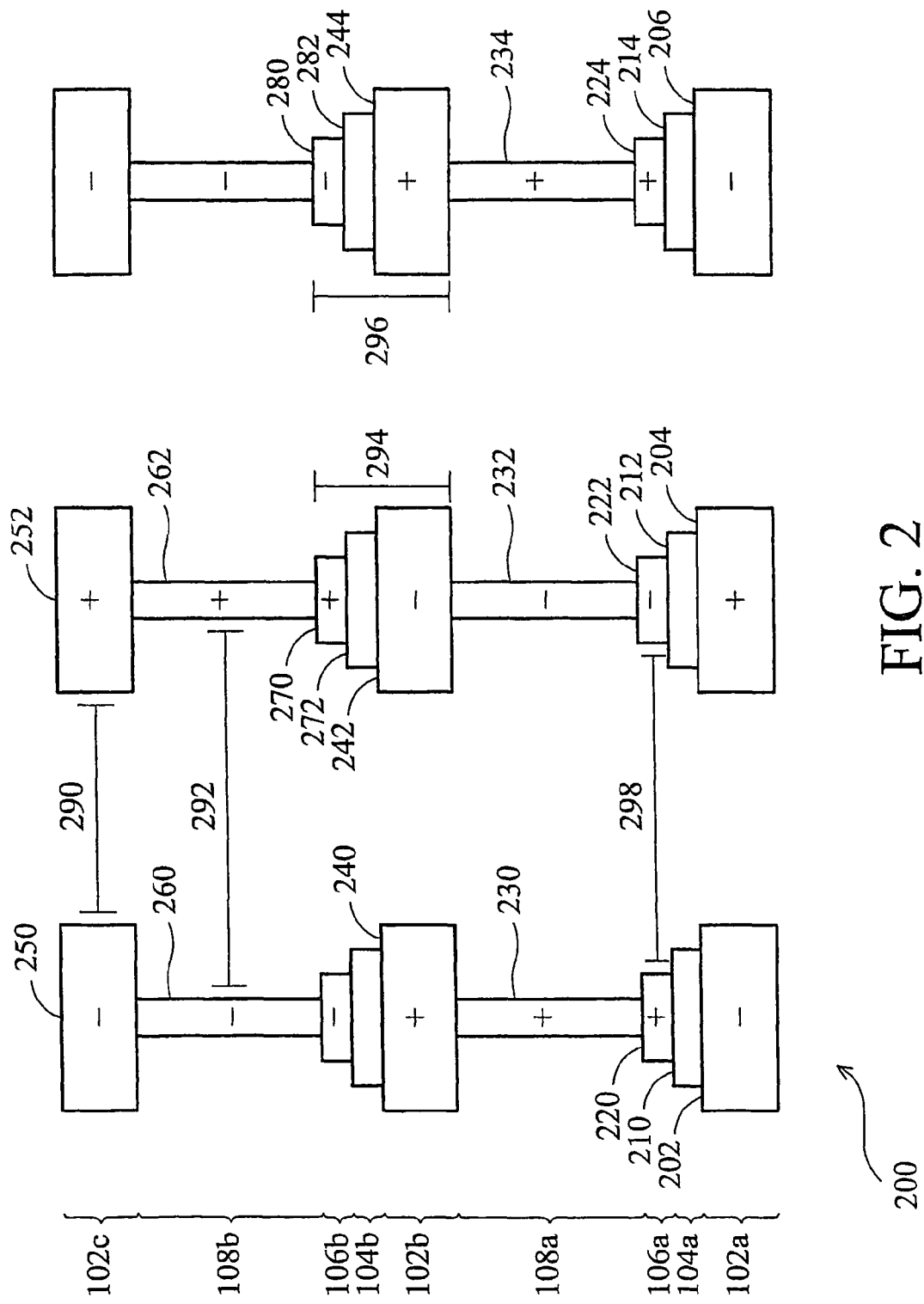
FIG. 2 is a side view illustrating features of a preferred embodiment of a capacitive structure for an integrated circuit.

With reference now to FIG. 2, there is shown a side view of a stacked capacitive structure for an integrated circuit, generally indicated by reference numeral 200. As illustrated, capacitor 200 is configured with two stacks of capacitors 100, with a final top layer 102c above the top layer 108b.

For purposes of clarity, each layer 102 is shown with three capacitive strips. For example, layer 102a is shows with a negative polarity capacitive strip 202, a positive polarity capacitive strip 204, and a negative polarity capacitive strip 206. One skilled in the art will understand that any number of conductive strips, and the structures formed above each strip, can also be employed.

Layer 104a is shown with three dielectric strips 210, 212, and 214. Layer 106a is shown with three extension strips 220, 222, and 224. Each extension strip is of a polarity opposite that of the conductive strip directly below it. Thus, for example, extension strip 220 is of a positive polarity and extension strip 222 is of a negative polarity.

Layer 108a is shown with three vias 230, 232, and 234. As described above, each via is of the same polarity as the extension strip to which it is coupled above and the capacitive strip to which it is coupled below. Thus, for example, via 230 is of the same (positive) polarity as extension strip 220 and capacitive strip 240.

Capacitor 200 thus illustrates the stacking of two or more capacitors 100. Layer 108a is coupled to a layer 102b above layer 108a. And layer 108b is coupled to a layer 102c above layer 108b. The capacitors 100 can be stacked in any number of iterations and configurations, adding or subtracting capacitors 100 to obtain an interdigitated capacitor with a predetermined number of layers to obtain a desired capacitance value. Thus, capacitor 200 exhibits improved the improved capacitance of a MIM capacitor, with the reduced chip area of a MOM capacitor.

For example, capacitor 200 exhibits a capacitance 290 between capacitive strip 250 and capacitive strip 252 of layer 102c. Capacitor 200 also exhibits a capacitance 292 between via 260 and via 262 of layer 108b. The unique MIM-type capacitance added by the extension strips and dielectric strips also provides additional capacitance.

For example, capacitor 200 exhibits a capacitance 294 between extension strip 270 of layer 106b and capacitive strip 242 of layer 102b, supported by dielectric strip 272 of layer 104b. Similarly, capacitor 200 exhibits a capacitance 296 between extension strip 280 of layer 106b and capacitive strip 244 of layer 102b, supported by dielectric strip 282 of layer 104b.

Moreover, the extension strips themselves add capacitance. For example, capacitor 200 exhibits a capacitance 298 between extension strip 220 and extension strip 222 of layer 106a. One skilled in the art will understand that the above capacitances are highlighted as illustrative and should not be construed as the only capacitive interactions of capacitor 220.

The capacitive strips, extension strips, and vias comprise a conductive material, including but not limited to copper, aluminum, titanium nitride (TiN), doped polysilicon, and any combinations thereof. The composition of one strip and/or via can vary from that of another strip and/or via, and the composition of the capacitive strips, extension strips, and vias need not be identical.

The dielectric strips comprise a dielectric material, including but not limited to silicon dioxide ($SiO_2$), silicon nitride (SiN), tantalum pentoxide ($Ta_5O_2$), and any combinations thereof. The selection of conductive materials and dielectric materials depends, in part, on the manufacturing process and the application intended for the capacitive elements, as one skilled in the art will understand.

Figure 3:
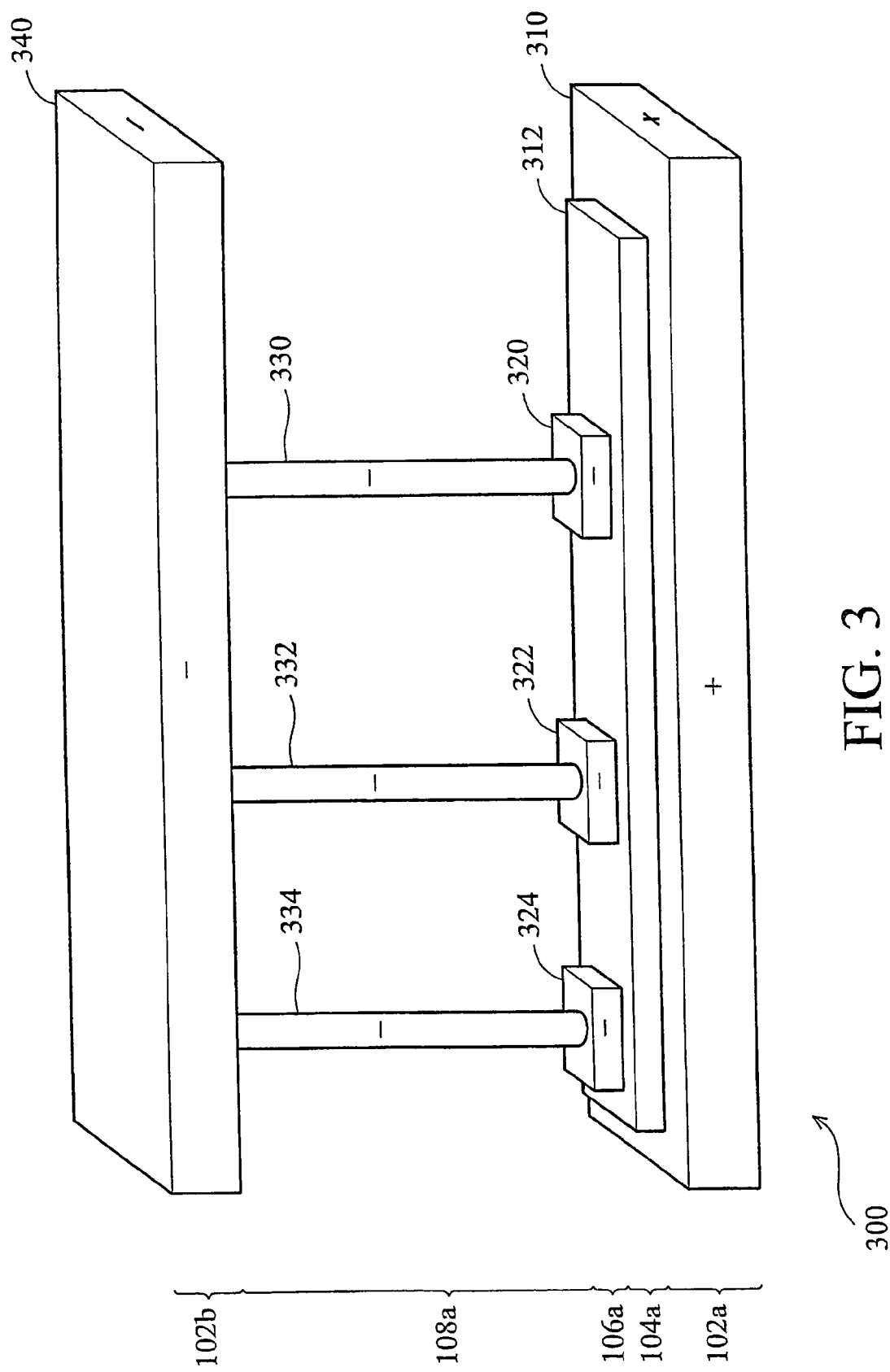
FIGS. 3 and 4 are schematic cross-sectional views illustrating features of a capacitive structure for an integrated circuit in accordance with other embodiments of the present invention.

With reference now to FIG. 3, there is shown a cross-sectional view of a capacitive structure for an integrated circuit, generally indicated by reference numeral 300. The first layer 102a comprises a capacitive strip 310, as described above. The second layer 104a comprises a dielectric strip 312, as described above.

In the illustrated embodiment, the third layer 106a comprises an extension strip segmented into a plurality of blocks 320, 322, and 324. Each block is coupled to a via of layer 108a. Thus, for example, block 320 is coupled to via 330. As described above, the vias of layer 108a are coupled to a capacitive strip 340 (of the same polarity as the vias) of layer 102b. Therefore, capacitor 100 can be configured with block-type extension strips. Forming the extension strips as block-type segments can simplify the manufacturing process, as one skilled in the art will understand.

Figure 4:
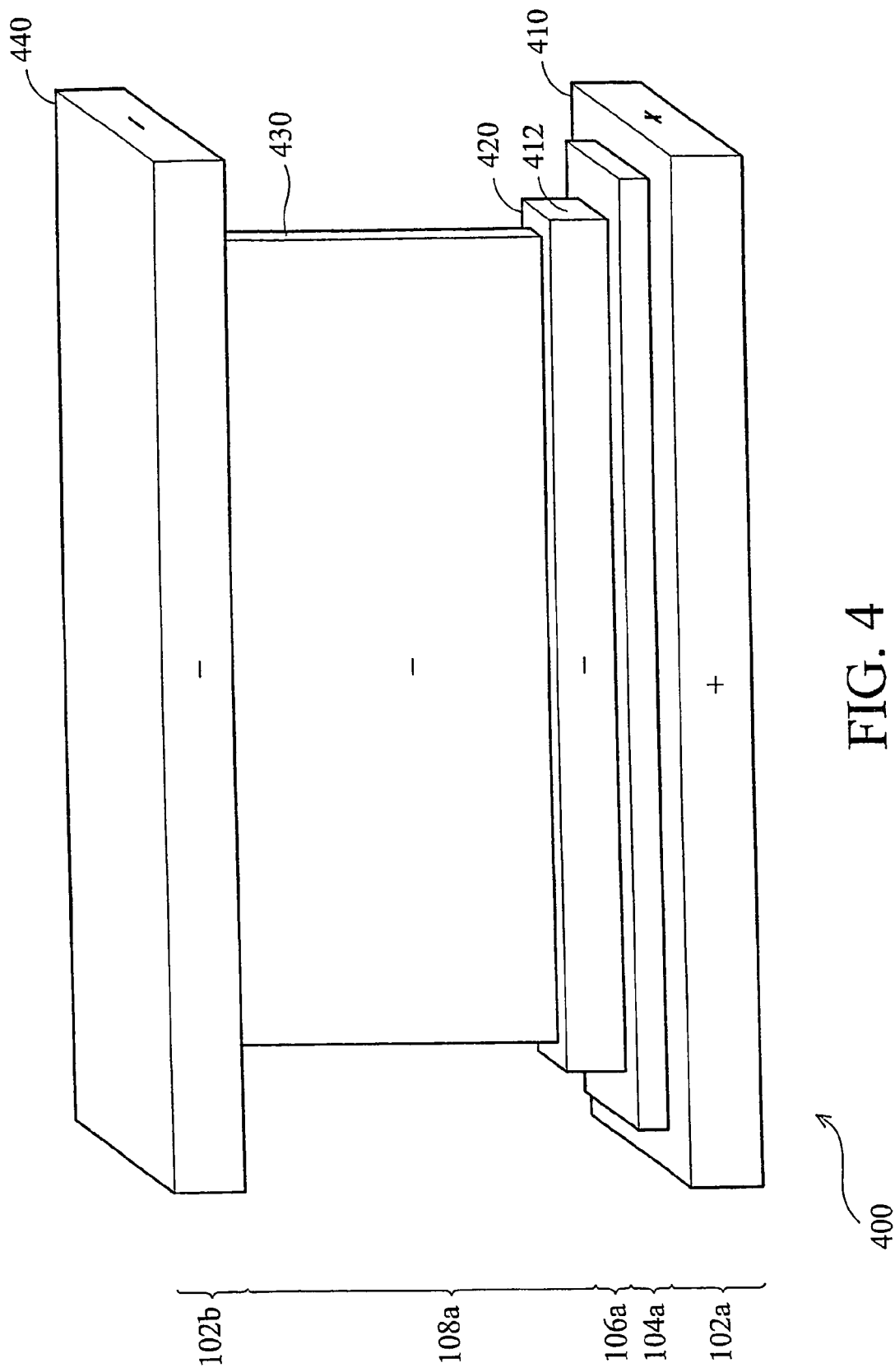

With reference now to FIG. 4, there is shown a cross-sectional view of a capacitive structure for an integrated circuit, generally indicated by reference numeral 400. The first layer 102a comprises a capacitive strip 410, as described above. The second layer 104a comprises a dielectric strip 412, as described above. The third layer 106a comprises an extension strip 420, as described above.

In the illustrated embodiment, the fourth layer 108a comprises a horizontally continuous via configured as a substantially vertical trench-type via 430, as opposed to the plurality of columns shown in FIGS. 1-3 for the vias. As described above, the continuous via 430 of layer 108a is coupled to a capacitive strip 440 (of the same polarity) of layer 102b. Therefore, capacitor 100 can be configured with vertical trench-type vias. Forming the vias as vertical trench-type vias can simplify the manufacturing process, as one skilled in the art will understand.

With reference now to FIGS. 5A-5L, there is shown a method of fabricating an improved interdigitated capacitive structure such as structure shown in FIG. 2. For ease of illustration, the process shown is limited to two adjacent conductive strips and the features formed above them. One skilled in the art will understand that other features and devices can also be formed concurrently with the features as described below.

Figure 5A:
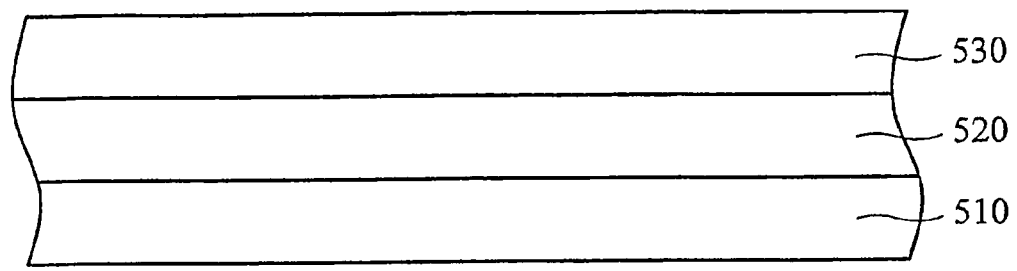
FIGS. 5A through 5L illustrate the steps of forming a capacitive structure for an integrated circuit, in accordance with one embodiment of the present invention.

A metal layer 520, as illustrated in FIG. 5A, is deposited on an isolation layer 510 by, for example, chemical vapor deposition (CVP), physical vapor deposition (PVD), or other suitable method. In some embodiments, a layer of antireflective coating can be deposited over the metal layer 520. A layer of photoresist 530 is then formed over the metal layer 520.

Figure 5B:
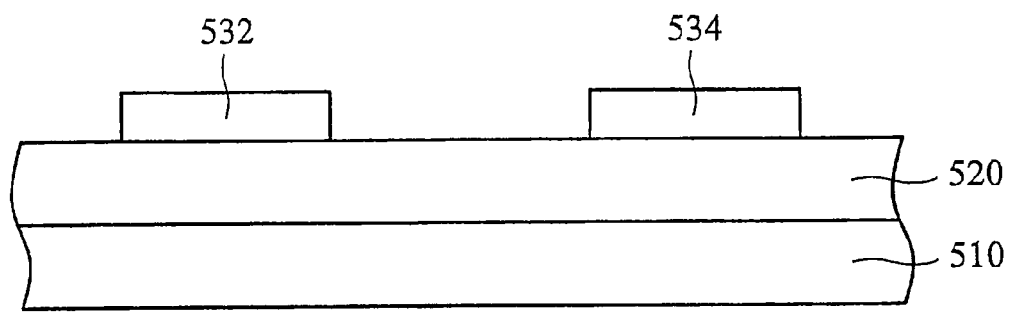
Figure 5C:
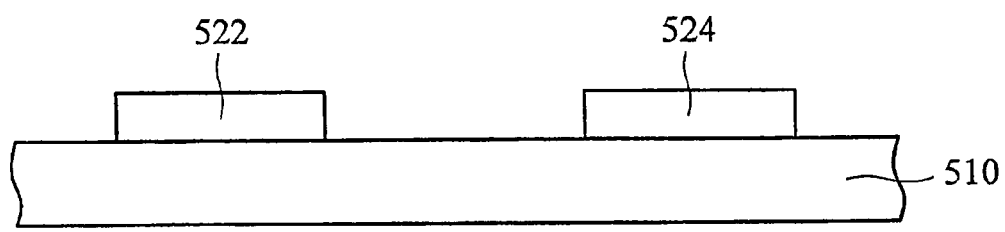

The photoresist is then exposed through a mask (not shown) with a pattern including conductive strips and other circuit elements. The pattern is developed on the photoresist, which is subsequently removed to expose strips 532 and 534, as shown in FIG. 5B. The uncovered area of metal layer 520 is then etched away and the remaining photoresist is removed, as one skilled in the art will understand. Thus, conductive strips 522 and 524 remain as shown in FIG. 5C.

Figure 5D:
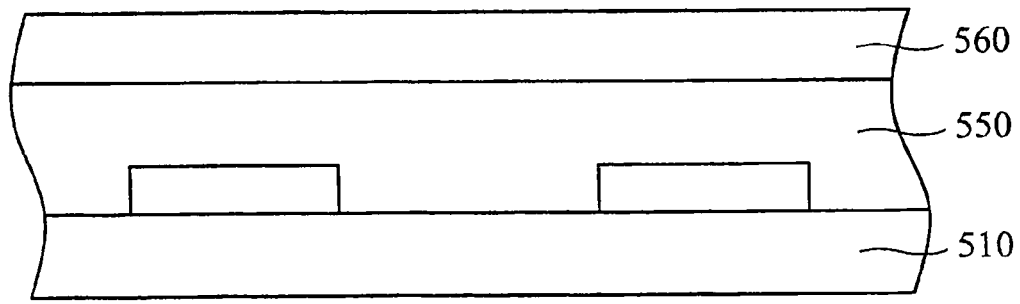
Figure 5E:
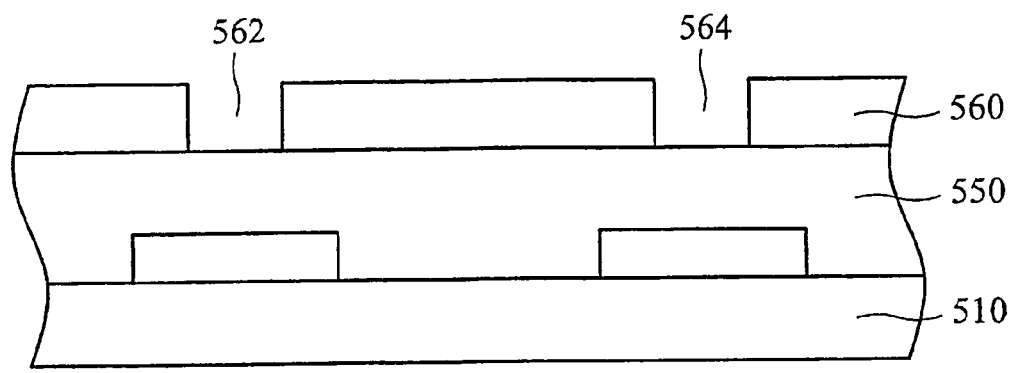

A layer of inter-metal dielectric (IMD) 550 is formed between the conductive strips and covers all other vacant areas, as shown in FIG. 5D. The upper surface of the IMD 550 can then be planarized by, for example, chemical mechanical polishing (CMP). Another layer of photoresist 560 is formed over IMD 550. Following another exposure and development process, photoresist on the areas where dielectric strips are located is removed and holes 562 and 564 are left, as shown in FIG. 5E.

Figure 5F:
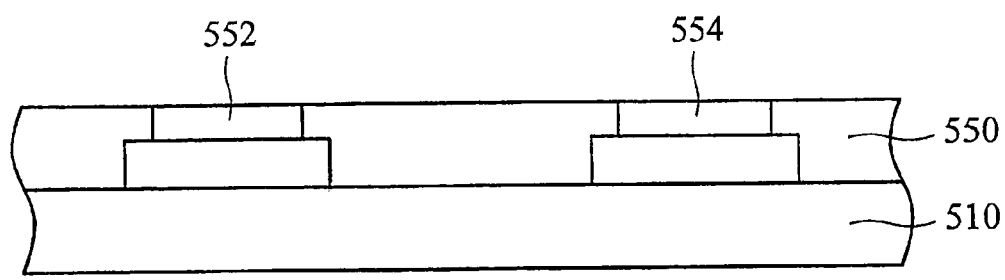

After etching holes through IMD 550 to the surface of the underlying features, a dielectric material is deposited and dielectric strips 552 and 554 are formed, as shown in FIG. 5F. In an alternate embodiment, dielectric strips 552 and 554 can be formed from the same inter-metal dielectric that comprises IMD 550, in which case the holes etched into IMD 550 stop above the surface of the underlying features (i.e., conductive strips 522 and 524), forming an appropriate shape as desired.

Figure 5G:
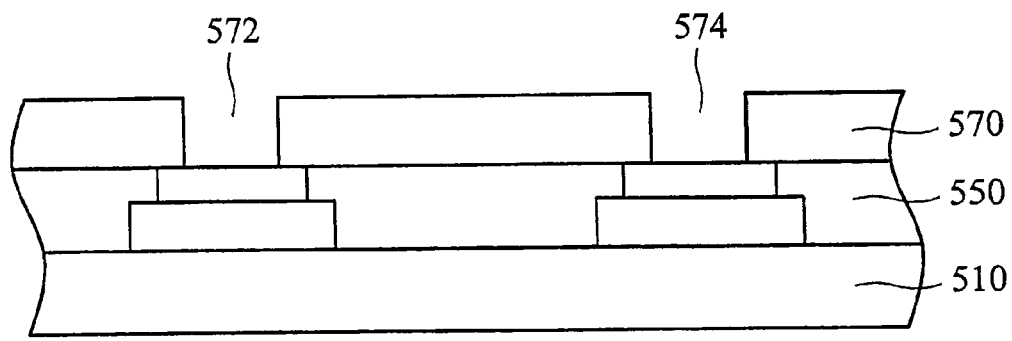
Figure 5H:
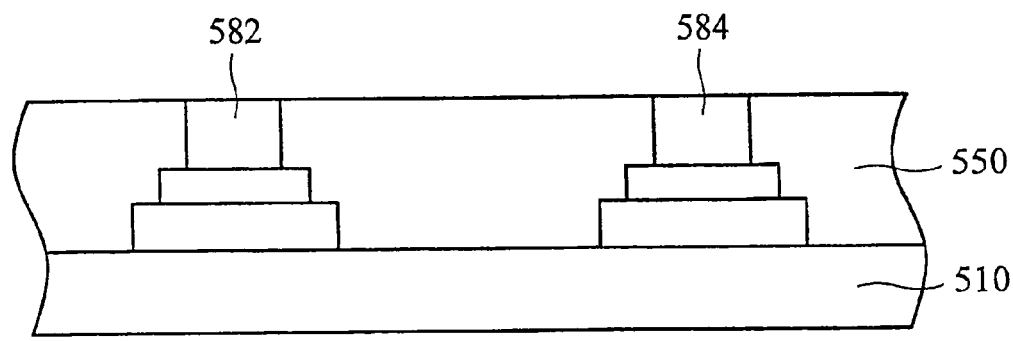

Following another exposure and development process, photoresist on the areas where extension strips are located is removed and holes 572 and 574 are left, as shown in FIG. 5G. After etching holes through IMD 550 to the surface of the underlying features (i.e., dielectric strips 552 and 554), a conductive material is deposited and extension strips 582 and 584 are formed, as shown in FIG. 5H.

Figure 5I:
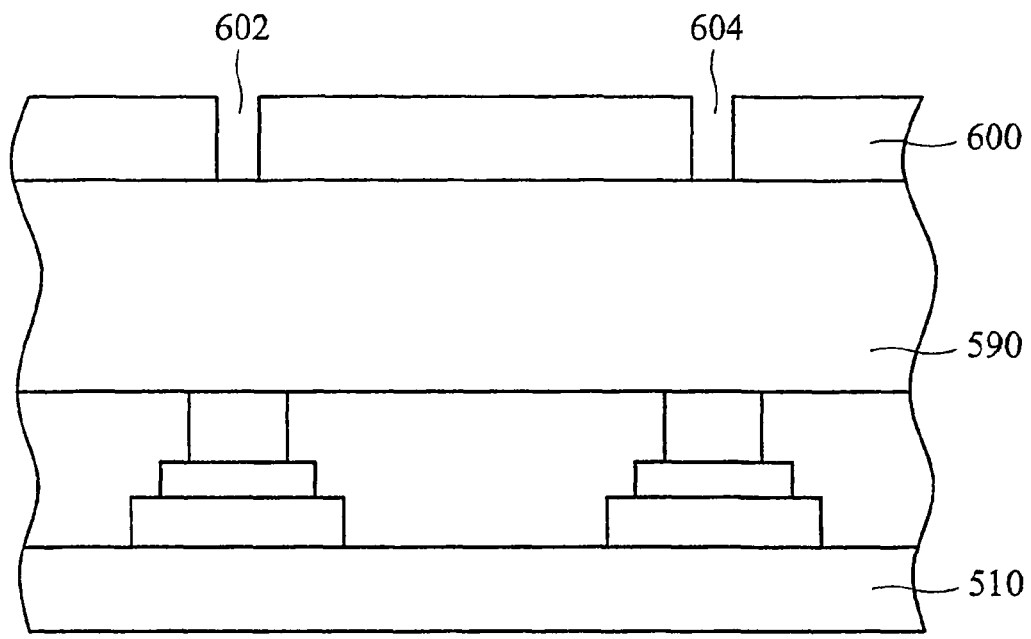
Figure 5J:
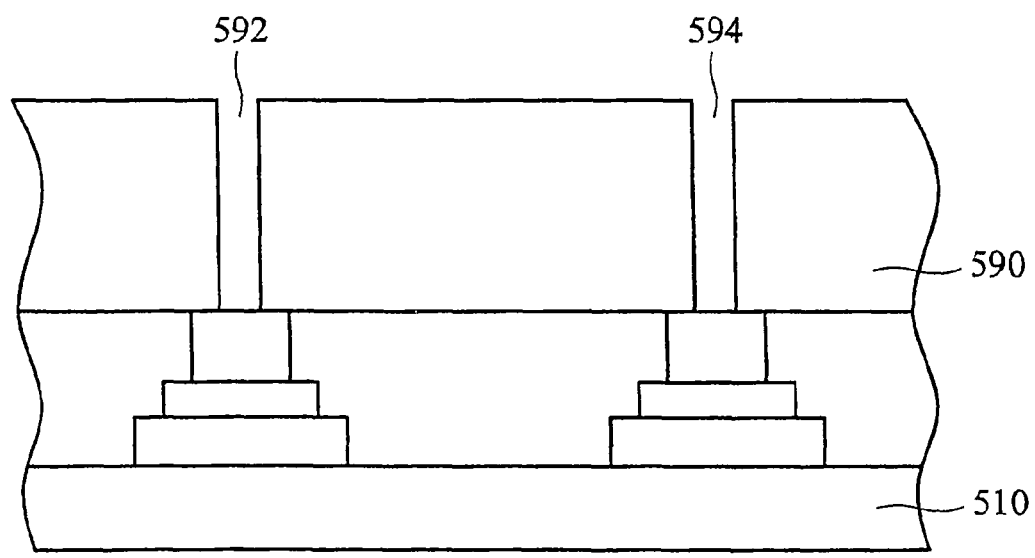

An inter-layer dielectric (ILD) 590 is formed over the remaining structures, as shown in FIG. 5I. In an alternate embodiment, ILD 590 can be formed from the same dielectric material as MD 550. The upper surface of ILD 590 can also be planarized by any of a number of methods known to one skilled in the art. Another layer of photoresist 600 is formed over ILD 590. Following an exposure and development process, photoresist on the area where vias are located is removed and holes 602 and 604 are left. After etching down to the surface of the underlying features (i.e., extension strips 582 and 584), vias 592 and 594 are formed, as shown in FIG. 5J.

Figure 5K:
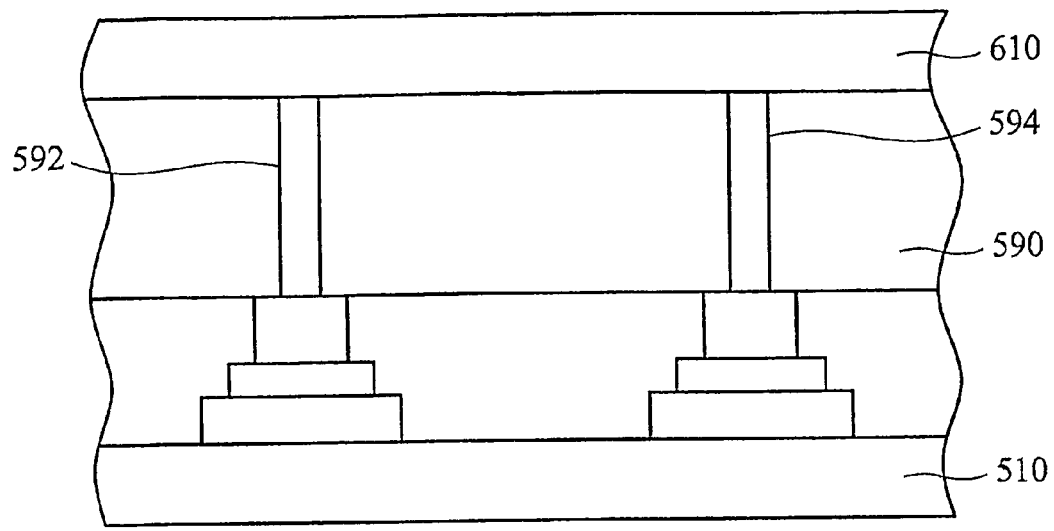
Figure 5L:
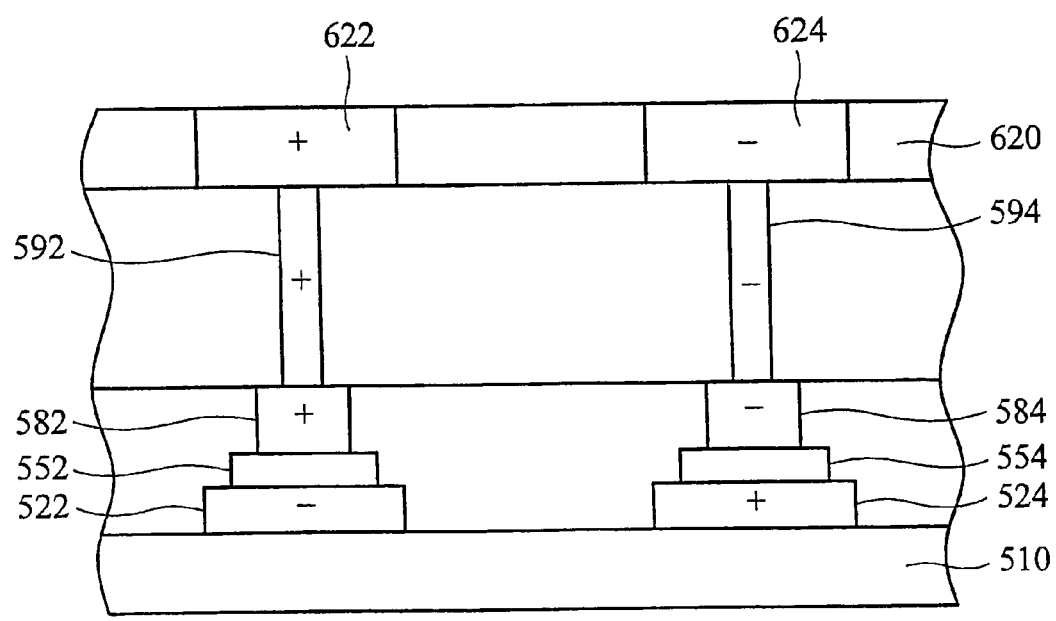

The vias 592 and 594 can then be filled with metal used to form a metal layer 610, as shown in FIG. 5K. A layer of photoresist (not shown) can deposited and exposed through a mask (not shown) with a pattern including conductive strips and other circuit elements. The pattern is developed on the photoresist, which is subsequently removed to expose strips that, when etched away and the remaining photoresist removed, form conductive strips 622 and 624 coupled to vias 592 and 594, as shown in FIG. 5L. A layer of inter-metal dielectric (IMD) 620 is formed between the conductive strips and covers all other vacant areas.

Thus, an improved interdigitated capacitive structure for an integrated circuit is formed. One skilled in the art will understand that the above process can be repeated to form another capacitive unit on top of IMD 620, with conductive strips 622 and 624 forming a layer 102 for the structure above.

Although the present invention and its advantages have been described in detail, it should be understood that various changes, substitutions and alterations can be made herein without departing from the spirit and scope of the invention as defined by the appended claims. For example, it will be readily understood by those skilled in the art that the various conductive and dielectric materials may be varied while remaining within the scope of the present invention. Further, as described above, the number of capacitive units and the number of conductive strips and associated structures can be varied as necessary to achieve a desired capacitance for a particular circuit or function.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor structure for an integrated circuit, comprising:
   a first layer of substantially parallel interdigitated first strips, adjacent first strips alternating between a first polarity and an opposite second polarity;
   a first capacitor dielectric layer of strips disposed over and in alignment with the interdigitated strips of the first layer;
   a first extension layer of substantially parallel interdigitated first extension strips disposed over the strips of the first capacitor dielectric layer and each having a length, adjacent ones of the first extension strips alternating between the first polarity and the second polarity, each first extension strip being disposed over the first capacitor dielectric strip that is disposed over a first strip of the opposite polarity; and
   a first sequence of first vias coupled to and arranged along the lengths of the first extension strips of the first extension layer, adjacent ones of the first vias alternating between the first polarity and the second polarity, each first via being disposed over a first extension strip of the same polarity.

2. The capacitor structure of claim 1, wherein each first extension strip comprises a substantially continuous line.

3. The capacitor structure of claim 1, wherein each first extension strip comprises a plurality of blocks.

4. The capacitor structure of claim 1, wherein each first via comprises a substantially continuous vertical trench.

5. The capacitor structure of claim 1, wherein each first via comprises a plurality of vertical columns.

6. The capacitor structure of claim 5, wherein each first extension strip comprises a plurality of blocks, each block coupled to one of the plurality of vertical columns.

7. The capacitor structure of claim 1, wherein each extension strip disposed over the strip of the first layer is capacitively coupled to the corresponding strip of the first layer.

8. The capacitor structure of claim 1, further comprising:
   a second layer of substantially parallel interdigitated second strips coupled to the first sequence of first vias, each second strip of either the first polarity or the second polarity, each second strip being disposed over a first via of the same polarity.

9. The capacitor structure of claim 8, further comprising:
   a second capacitor dielectric layer comprising parallel dielectric strips disposed over and aligned with the strips of the second layer;
   a second extension layer of substantially parallel interdigitated second extension strips disposed over the second capacitor dielectric layer, adjacent second extension strips alternating between the first polarity and the second polarity, each second extension strip being disposed over a second strip of the opposite polarity;

a second sequence of second vias coupled to the second extension layer, adjacent second vias alternating between a second via of the first polarity and a second via of the second polarity, each second via disposed over a second extension strip of the same polarity; and a third layer of a sequence of substantially parallel interdigitated third strips coupled to the second vias, each third strip of either the first polarity or the second polarity, each third strip disposed over a second via of the same polarity.

10. An integrated circuit comprising:

first strips of a first polarity and second strips of a second polarity disposed in and in horizontal alignment within a first insulating layer, the first polarity and the second polarity being opposite, wherein the first and the second strips are disposed in an alternating sequence within the first insulating layer;

a second insulating layer disposed over the first insulating layer;

a third insulating layer disposed over the second insulating layer;

third strips of the first polarity and fourth strips of the second polarity disposed in and in horizontal alignment within the third insulating layer, the third and fourth strips each having a length, wherein the third strips are disposed over the second strips to form first capacitors, and the fourth strips are disposed over the first strips to form second capacitors;

a fourth insulating layer disposed over the third insulating layer; and first vias of the first polarity and second vias of the second polarity disposed within the fourth insulating layer, wherein the first vias overlie the third strips along the lengths of the third strips and are coupled to the third strips and the second vias overlie the fourth strips along the lengths of the fourth strips and are coupled to the fourth strips, and wherein the first vias and the second vias are arranged in alternating polarity so that the first and second vias form third capacitors between adjacent first and second vias.

11. The integrated circuit of claim 10, further comprising:

a fifth insulating layer disposed over the fourth insulating layer; and fifth strips of the first polarity and sixth strips of the second polarity disposed in the fifth insulating layer, wherein the fifth strips are coupled to the first vias, and the sixth strips are coupled to the second vias, and wherein the fifth strips and the sixth strips form fourth capacitors.

12. The integrated circuit of claim 11, wherein the third and the fourth strips alternate within the third insulating layer, and wherein the fifth and the sixth strips alternate within the fifth insulating layer.

13. The integrated circuit of claim 10, wherein the first and the second strips form fifth capacitors, and wherein the third and fourth strips form sixth capacitors.

14. The integrated circuit of claim 10, wherein the first insulating layer comprises dielectric strips disposed on the first strips and the second strips.

* * * * *